United States Patent [19]
Roberts

[11] 3,832,732

[45] Aug. 27, 1974

[54] LIGHT-ACTIVATED LATERAL THYRISTOR AND AC SWITCH

[75] Inventor: John S. Roberts, Export, Pa.

[73] Assignee: Westinghouse Electric Corporation, Pittsburgh, Pa.

[22] Filed: Jan. 11, 1973

[21] Appl. No.: 322,831

[52] U.S. Cl. ......... 357/19, 317/235 N, 317/235 AB, 317/235 AN

[51] Int. Cl. .............................................. H01l 15/00

[58] Field of Search ....................... 317/235, 27, 48.2

[56] References Cited

UNITED STATES PATENTS

| | | | |
|---|---|---|---|
| 3,504,114 | 3/1970 | Irwin et al. | 178/6 |
| 3,590,344 | 6/1971 | Roberts et al. | 317/235 |
| 3,697,833 | 10/1972 | Nakata | 317/235 |
| 3,699,406 | 10/1972 | Mapother et al. | 317/235 |
| 3,719,863 | 3/1973 | Ogawa et al. | 317/235 |

*Primary Examiner*—Rudolph V. Rolinec
*Assistant Examiner*—E. Wojciechowicz
*Attorney, Agent, or Firm*—C. L. Menzemer

[57] ABSTRACT

A light-activated thyristor or ac switch is provided in a semiconductor body with the emitter and base regions adjoining the same major surface. The central PN junction between the base regions has shallow impurity concentration gradients less than about $1 \times 10^{22}$ per $cm^4$ and preferably less than about $1 \times 10^{20}$ per $cm^4$. Preferably the base regions have surface impurity concentrations between about $2 \times 10^{15}$ and $1 \times 10^{18}$ per $cm^3$ and surface widths substantially equalizing the gains of the equivalent transistors of the structure. The PN junctions may be interwoven, substantially linear, and/or offset to provide a higher power, and/or more uniform current distribution in the device.

9 Claims, 11 Drawing Figures

LIGHT-ACTIVATED LATERAL THYRISTOR AND AC SWITCH

FIELD OF THE INVENTION

The present invention relates to semiconductor devices and particularly thyristors and ac switches gated by light radiation.

BACKGROUND OF THE INVENTION

Thyristors are non-linear, solid state devices that are bistable; that is, they have a high and a low impedance state. They are commonly four layer PNPN structures. Thyristors are usually switched from one impedance state to the other by means of a control or gating signal applied to one of the base regions. Thyristors can also be gated by light radiation incident on the base regions.

Light-activated thyristors are well-known for their efficient switching. The incident light generates electron-hole pairs in the vicinity of the reverse biased center PN junction which, instead of recombining, are swept across the junction and increase the anode-to-cathode current. This current increases with increased light, increasing the current gains ($\alpha$'s) of the PNP and NPN transistor equivalents of the structure. If the photo-current is high enough, it will switch the thyristor from the high-impedance, blocking state to the low-impedance, conducting state.

A major problem with such light-activated thyristors is rapid generation of sufficient photocurrent to gate the device. A standard four-layer thyristor can have its base regions directly light irradiated only at the edges around the periphery of the semiconductor body. Such "edge fired" devices therefore have a very small area sensitive to the incident light and in turn have a relatively long switching time or current rise time (i.e., the time required to switch from the blocking mode to conducting mode on gating). Furthermore, encapsulation of such "edge fired" devices is difficult.

The sensitive area has been greatly increased and the encapsulation problem eliminated by irradiating the base regions through the cathode-emitter. That is, light with wave lengths very near infrared and longer are penetrated through the cathode-emitter region to generate electron-hole pairs in the sensitive region of the bases, see U.S. Pat. No. 3,590,344. Such light-activated devices have improved rise times and have been used to switch high power devices without undue power dissipation. However, the light sensitivity of the device is reduced by attenuation of the light as it passes through the cathode-emitter layer of the device. Thus, even higher current rise times could be attained if a device could be made which would provide direct illumination of substantially all of the sensitive region in the vicinity of the reverse biased PN junction.

An ac switch is a bidirectional thyristor. The most common of these is the "triac" which is a three-terminal switch wherein one of the terminals is a gate electrode. It is a multilayer structure which is the equivalent of two inverse-parallel thyristors in a single body. This requires judicious arrangement of the electrodes relative to the various P and N regions, see Ankrum, Semiconductor Electronics, pp. 531–32 (1971). Adaption of the structure to permit light-activation is therefore compounded over those enumerated in connection with light-activated thyristors. Moreover, these devices are limited in their high frequency capability by reason of the common regions of the equivalent thyristors. These regions must be in a conduction mode on one half of the ac cycle and in a blocking mode on the other half of the cycle.

SUMMARY OF THE INVENTION

A light-activated thyristor and light-activated ac switch are provided which have higher light sensitivity. The increased sensitivity results from substantially the entire sensitive region in the vicinity of the reverse biased junction being directly exposed to the activating light radiation. The increased sensitivity also reduces the intensity requirements for the activating light source and the need for complex optical systems to fire the device.

The lateral thyristor is formed in a semiconductor body with a given impurity concentration and with a major surface of preferably planar configuration, such as a doped single crystal silicon wafer. The thyristor has base and emitter regions disposed laterally within the body with each of the four active regions adjoining the major surface. The body has a first impurity region of conductivity type opposite the given impurity concentration adjoining the major surface and forming a first PN junction with the given impurity concentration, a second impurity region of conductivity type opposite the first impurity region adjoining the major surface, contained in the first impurity region and forming a second PN junction with the first impurity region, and a third impurity region of major conductivity type opposite the given impurity concentration adjoining the surface, spaced from the first impurity region and forming a third PN junction with the given impurity concentration and a fourth residual impurity region adjoining the major surface between the first and third impurity regions.

The first and fourth impurity regions provide the base regions and the second and third impurity regions provide the emitter regions of the thyristor. The first (center) PN junction between the base regions has shallow surface impurity concentration gradients less than about $1 \times 10^{22}$ per $cm^4$ and preferably less than about $1 \times 10^{20}$ per $cm^4$. It should be noted that the impurity concentration gradient is the rate of change of the impurity concentrations from the PN junction transition. Thus, the gradients extend in both directions from the central junction toward the other PN junctions which are between the base and emitter regions.

In addition, it is preferred that both base regions have surface impurity concentrations between about $2 \times 10^{15}$ and $1 \times 10^{18}$ per $cm^3$ and have surface widths substantially equalizing the current gains of the equivalent transistor of the structures. One or more of the PN junctions may be interwoven, have substantial linear segments, and/or be offset to provide greater power capacity, and more uniform current distribution with a given size device.

The gating of the thyristor is provided by a light radiation source capable of irradiating the major surface with gating light at least at portions of the first and fourth impurity regions. Electron-hole pairs are thereby created in the vicinity of the first (center) PN junction between the first and fourth impurity regions which are swept across the junction by a reverse bias potential. In operation, gating current is thus created which will switch the thyristor from the high impedance, blocking mode to the low impedance, conducting mode.

The thyristor circuit is completed by a power source applying a voltage potential ohmically between the second impurity and third impurity regions. The voltage potential provides a forward bias to the second and third PN junctions and a reverse bias to the first (center) PN junction. To achieve this, metal contacts are attached to the body at the major surface to make separate ohmic contacts with the second impurity and third impurity regions. The power source is then ohmically contacted to the metal contacts by standard secondary contacts.

Where bidirectional switching is desired, two of the thyristors can be positioned side-by-side in the same semiconductor body. The thyristors can thus be interconnected back-to-back by ohmic contacts connecting the second impurity region of each thyristor with the third impurity region of the other thyristor to form an ac switch. Preferably the interconnecting contacts are planar and overlay a dielectric layer such as silicon dioxide which adjoins the major surface. The light-activated ac switch is simply fabricated and highly light sensitive. In addition, the light-activated switch is capable of higher frequency operation than other light-activated ac switches and electrode-activated switches.

Other details, objects and advantages of the invention will become apparent as the following description of the present preferred embodiments and the present preferred methods of practicing the same proceeds.

BRIEF DESCRIPTION OF THE DRAWINGS

In the accompanying drawings are shown the present preferred embodiments of the invention and are illustrated the present preferred methods of practicing the same in which.

DESCRIPTION OF THE PREFERRED EMBODIMENTS

Figure 1:
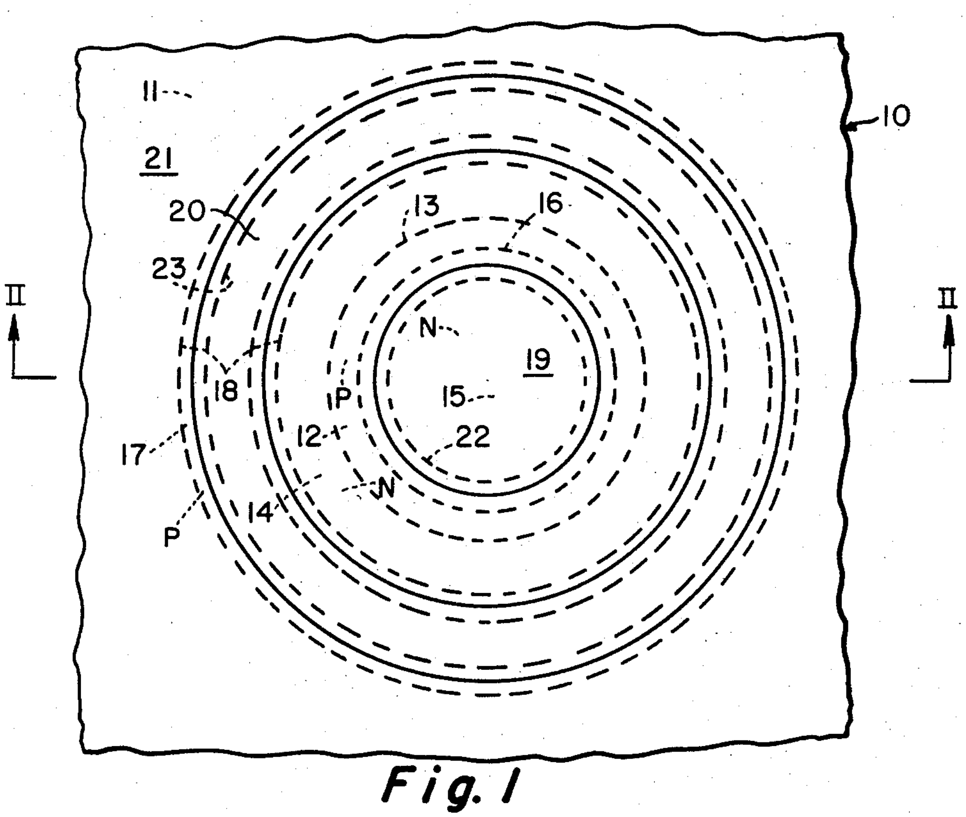
FIG. 1 is a top view of a light-activated lateral thyristor in a semiconductor body.
Figure 2:
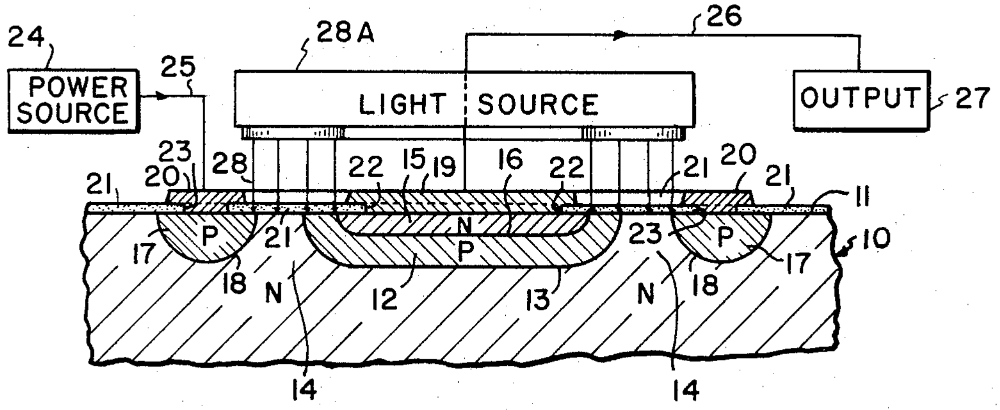
FIG. 2 is a partial cross-sectional view in elevation taken along line II—II of FIG. 1 with the thyristor circuit shown schematically.

Referring to FIGS. 1 and 2, a light-activated lateral thyristor is shown disposed in semiconductor body 10. Body 10 typically singularly contains the lateral thyristor, but may be an integrated circuit containing a large number of other components.

Body 10 has a given impurity concentration and has major surface 11 of planar configuration through which the lateral thyristor is formed by standard diffusion techniques. Typically, body 10 is a single-crystal silicon wafer having an N-type conductivity of substantially uniform impurity concentration therethrough of between $2.0 \times 10^{15}$ and $5.0 \times 10^{16}$ per $cm^3$ (resistivity between 0.2 and 20 ohm-cms).

First central impurity region 12 is found adjoining major surface 11. Region 12 forms a first PN junction 13 with the given impurity concentration of body 10. PN junction 13 has an impurity concentration gradient less than $1 \times 10^{22}$ per $cm^4$ and preferably less than $1 \times 10^{20}$ per $cm^4$. And region 12 preferably has a surface impurity concentration between $1 \times 10^{16}$ and $1 \times 10^{18}$ per $cm^3$.

Typically region 12 is formed in body 10 adjoining major surface 11 by standard oxidizing, photoresist, etching and diffusion techniques. That is, body 10 is heated in an atmosphere of oxygen gas or steam to a temperature preferably between 1,000 and 1,200°C to form an oxide layer 21 over surface 11 typically of about 10,000 A in thickness; window (not shown) is opened in the oxide layer by photomasking and subsequently etching the portions of the oxide layer; and a P-type impurity such as boron is diffused into exposed portions of surface 11 through the window in the oxide layer to a depth typically between 10 and 50 microns, by heating body 10 typically in open-tube apparatus to about 1,000°C in an atmosphere containing diborane ($B_2H_6$) gas as a constant diffusion source.

Second central impurity region 15 is then formed adjoining major surface 11 and contained in first impurity region 12. Region 15 forms second PN junction 16 with region 12 and preferably has a surface impurity concentration between $1 \times 10^{19}$ and $1 \times 10^{21}$ per $cm^3$. Preferably N-impurity region 15 is formed of phosphorus using the same oxidizing, photoresist, etching and diffusion techniques used to form first impurity region 12. Preferably, the oxide layer 21 is extended to close the windows used to diffuse region 12 during the diffusion of region 12 so that the next sequential steps are opening of new, smaller, concentric window 22 and diffusing in region 15 typically to a depth of between 5 and 15 microns. The impurity source used is typically phosphine or arsine gas ($PH_3$ or $AsH_3$), or phosphine or arsine halide or oxyhalide vapor (e.g. $PCl_3$, $PBr_3$, $AsCl_3$, $AsBr_3$ or $POCl_3$) diffused as a constant-diffusion source with open-tube apparatus.

Third peripheral impurity region 17 is thereafter formed in body 10 adjoining major surface and spaced from first impurity region 12. Region 17 forms third PN junction 18 with the given impurity concentration of body 10 and fourth residual impurity region 14 between first and third impurity region 12 and 17. Preferably region 17 has a surface impurity concentration between $1 \times 10^{19}$ and $1 \times 10^{20}$ per $cm^3$ and a depth between 10 and 25 microns. Typically third impurity region 17 is formed of boron using the same oxidizing, photoresist, etching and diffusion techniques as used to form P-impurity region 12 by opening annular window 23 in oxide layer 21. Region 17 may be formed before, after or simultaneously with region 12.

The lateral thyristor is finished by forming metal contacts 19 and 20 to regions 15 and 17 at surface 11.

Aluminum, gold or some other suitable metal is evaporated or RF sputtered over oxide layer 21 to close windows 22 and 23 and to form a metal layer on layer 21. A negative photoresist and suitable etchant (e.g. 10 percent sodium hydroxide solution) is then used to remove the metal layer from portions of surface to leave circular contact 19 and annular contact 20 in and adjacent to windows 22 and 23. The metal in the windows is then alloyed with the silicon body by heating the body 10 to form low-resistant ohmic contacts. Oxide layer 21 thereafter can be left on the surface as part of the final device to stabilize the surface states and provide a passivating layer transparent to the activating light.

The thyristor thus formed has a cathode-emitter corresponding to first impurity region 15, a cathode-base corresponding to second impurity region 12, and an anode-emitter corresponding to third impurity region 17, and an anode-base corresponding to fourth impurity region 14.

The light-activated thyristor circuit is completed by applying a voltage potential from a power source 24 through lead 25 to contact 20 and from contact 19 through lead 26 to output 27 so that the region 17 is positive relative to region 15. The thyristor is thereby forward biased with PN junctions 16 and 18 forward biased and PN junction 13 reverse biased. Current is thus capable of flowing in the direction shown by arrows on leads 25 and 26 when the thyristor is in the conduction mode. The switching circuit is provided by a light radiation source 28A which illuminates major surface 11 at first impurity region 12 and fourth residual region 14 (i.e., the base regions) with light radiation 28 to gate the thyristor.

The lateral thyristor has internal current flow substantially parallel to the same surface 11, which all PN junctions adjoin. The device therefore has high light sensitivity because essentially all of the light sensitive region is near or at the surface and both base regions are directly exposed to gating light. The device is more sensitive to light activation than other light-activated thyristors such as those fired through the cathode-emitter and those which are edge fired.

Figure 2A:
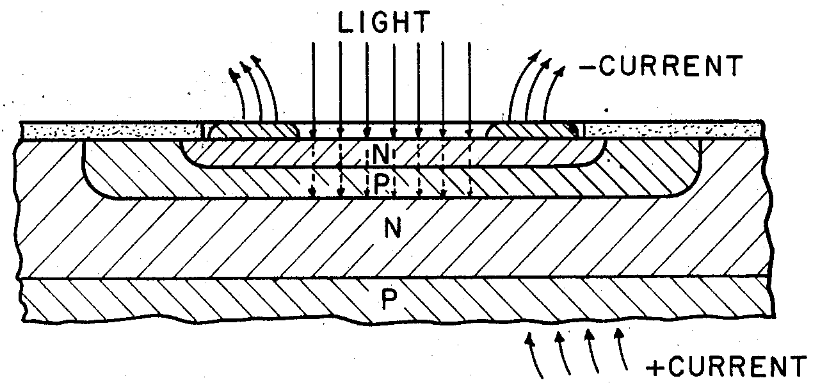
Fig. 2A PRIOR ART
FIG. 2A is a cross-sectional view in elevation of a prior art light-activated power thyristor.

Moreover, since both base regions of the lateral thyristor of the present invention can be readily driven by light radiation, the gains of the two equivalent transistors of the structure can be equalized and in turn the base regions made nearly symmetric. This is contrary to previous thyristors (as shown by FIG. 2A) wherein the N-impurity base region has a much lower impurity concentration and is much wider than the P-impurity base region so that the gain ($\alpha$) of the PNP transistor section is relatively low at all current levels and not significantly dependent on operating conditions, while the gain ($\alpha$) of the NPN transistor section is quite small at very low currents and highly dependent upon current, approaching unity at currents where the device latches "on."

Gain symmetry is provided in the base regions of the present invention by making the widths of the base regions 12 and 14 at surface 11 substantially equal and having the impurity concentration in the base regions approach each other in absolute values. Equalization of the widths of the base regions also reduces the criticality of photoresist alignment, etching and diffusion in making the P-impurity regions 12 and 17 and N-impurity region 15, and thereby substantially reduces the difficulty of controlling the current distribution and current gain. Equalization of the impurity concentration in turn permits the PN junctions to have shallower impurity concentration gradients so that difficulty of decrease in breakdown voltage with increased radius of curvature is essentially non-existent. The current handling capability of the lateral thyristor can thus be increased simply by extending the junction lengths, and design breakdown voltages comparable to other power thyristors can be achieved depending on the quality of the surface passivation.

It is preferred that the widths of the base regions 12 and 14 at surface 11 be greater than 25 microns. This makes photoresist alignment, etching and diffusion of the regions 12, 15 and 17, while maintaining substantially uniform current distribution and design current gain, relatively easy. Moreover, it is preferred that impurity concentration gradients at the PN junctions be less than $1 \times 10^{20}$ per $cm^4$. This permits light-activated lateral thyristors to be provided which have high breakdown voltages and high power capacity.

Figure 3:
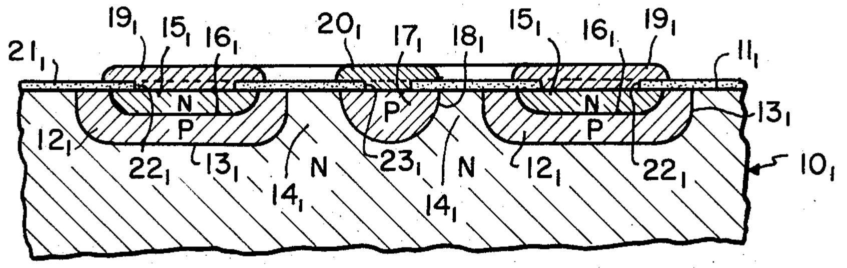
FIG. 3 is a partial cross-sectional view in elevation of an alternative light-activated lateral thyristor.

Referring to FIG. 3, it is shown that the arrangement of the impurity regions may be reversed. The first and second impurity regions $12_1$ and $15_1$ are thus peripheral and, in some cases, concentric of the third impurity region $17_1$, instead of central thereof. All other parameters of the device are as described above in connection with FIGS. 1 and 2.

Regarding the cross-sectional area of the device, the lateral current permissible per unit length of emitter should follow fairly closely that of the power transistor. This value has been empirically determined to be about 4mA/(mil of emitter length); however, as the lateral thyristor is made more symmetric with respect to gain, this number will decrease. The permissible current (mil of emitter length) is likely greater than that for a switching transistor if one takes into account the difference in geometry. For a 1 ampere device, it is therefore contemplated that an emitter "length" (really cross-sectional area) of about 250 mils is required.

Several different approaches are therefore proposed to provide the lateral thyristor with the longest cathode-emitter junction length (i.e., PN junction 16) within a given surface area to provide an inexpensive device. The basic circular configuration is shown in FIG. 1 where second impurity region 15 is circular and first, third and fourth impurity regions 12, 14 and 17 are annular.

Figure 4:
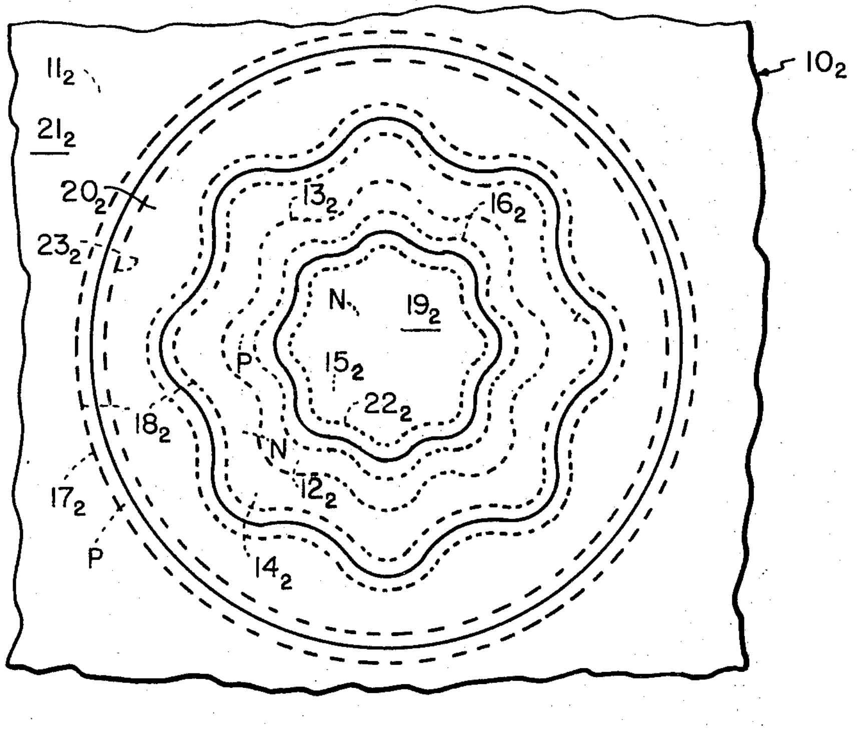
FIG. 4 is a top view of a third light-activated lateral thyristor in a semiconductor body.
Figure 5:
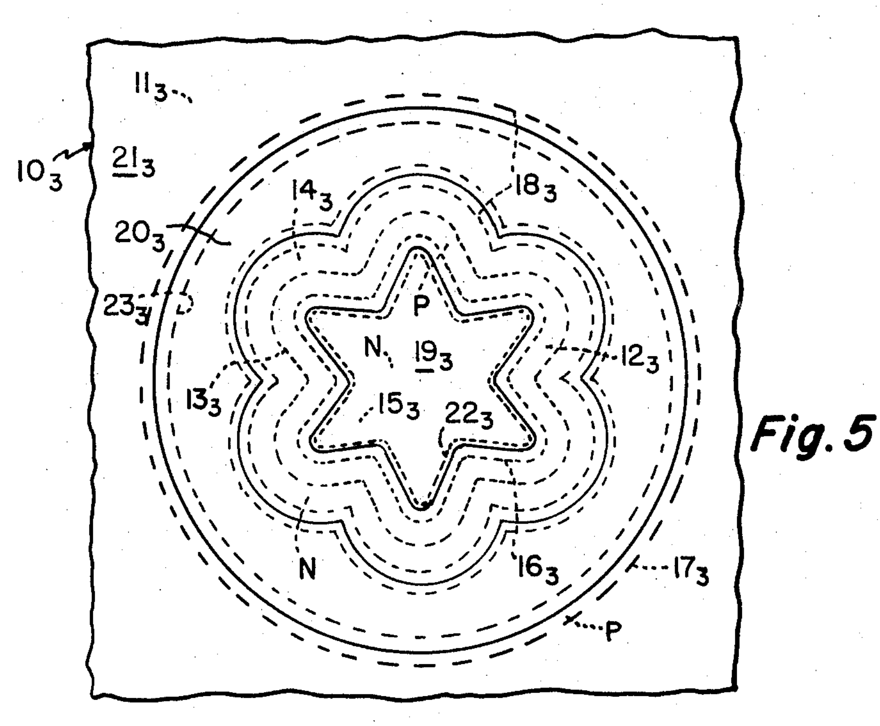
FIG. 5 is a top view of a fourth light-activated lateral thyristor in a semiconductor body.

Referring to FIGS. 4 and 5, the emitters and base regions can be interwoven to increase the junction length and in turn the cross-sectional area without increasing the surface area of the body which is used. The components and regions corresponding to those previously enumerated in connection with FIGS. 1 and 2 have again been designated by subscripts. Because of the shallow impurity concentration gradient, no difficulty is enountered in voltage breakdown by varying the curvature of the junction.

Figure 6:
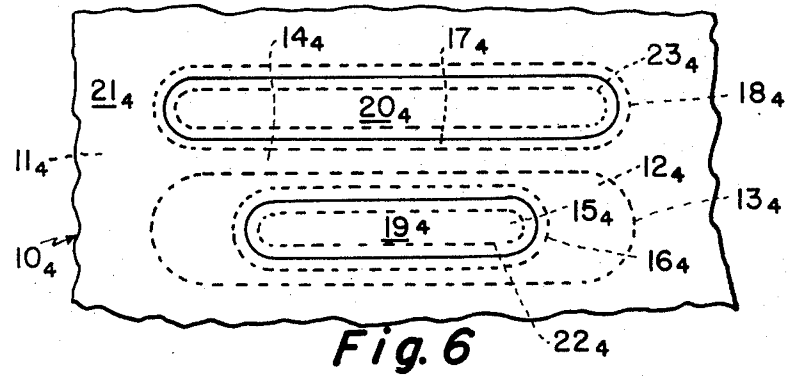
FIG. 6 is a top view of a fifth light-activated lateral thyristor in a semiconductor body.
Figure 7:
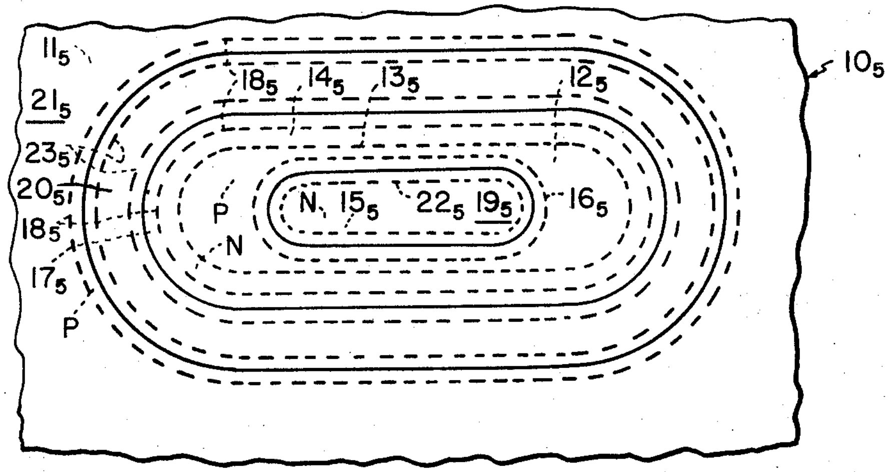
FIG. 7 is a top view of a sixth light-activated lateral thyristor in a semiconductor body.

Referring to FIGS. 6 and 7, "linear" designs of the lateral thyristor are shown. Again the components and regions corresponding to those enumerated in connection with FIGS. 1 and 2 have been designated by subscripts. In FIG. 6, third impurity region $17_4$ is offset to one side of first impurity region $12_4$ so that PN junctions $13_4$ and $18_4$ parallel each other along their linear portions. The only critical photoresist alignment in this embodiment is one of rotation, when putting in the N-impurity region $15_4$. Any error in translation merely produces essentially unimportant changes in the location of the device in the chip or the base width. A change in the base width changes the sensitivity of the device somewhat, but does not change light sensitivity in material respects.

The design of FIG. 7 more efficiently utilizes the silicon material and reduces the ratio of junction length to current rating. The structure approaches the circular structure, but with the regions elongated similar to the design of FIG. 6. In this embodiment translational alignment in one direction is, however, critical, for if the width of first impurity region $12_5$ is not the same on both sides of the second impurity region $15_5$, the current will concentrate on one "side" of the device.

The light triggering sensitivity of the invention will vary with the particular embodiment. If the illuminating system does not use an optical focusing system, the light source should be a broad band visual light source. The area irradiated will depend on the aperture and the intensity of the nonconcentrated source.

Figure 8:
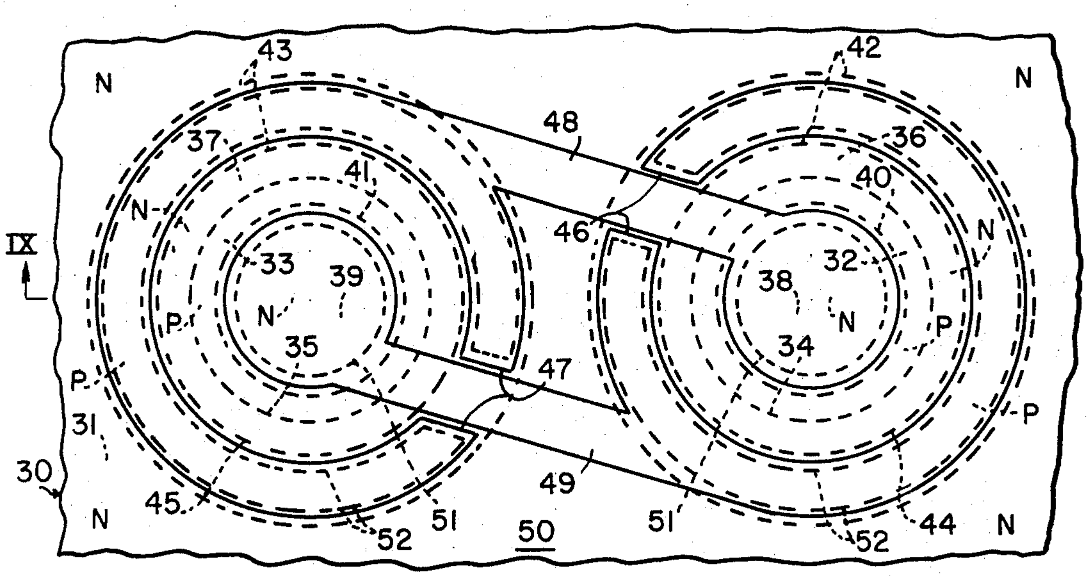
FIG. 8 is a top view of a light-activated ac switch in a semiconductor body.
Figure 9:
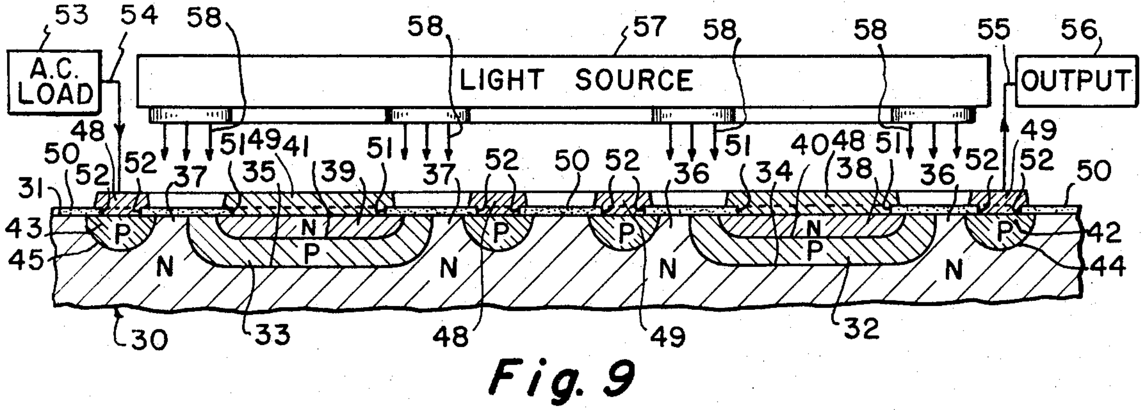
FIG. 9 is a partial cross-sectional view in elevation taken along line IX—IX of FIG. 8.

Referring to FIG. 8, a light-activated ac switch is shown for bidirectional conduction. The device is essentially two lateral thyristors similar to that shown in FIGS. 1 and 2 arranged side-by-side in a single semiconductor body.

Body 30 with a given impurity concentration has major surface 31 of planar configuration, in which the light activated switch is formed by standard diffusion techniques. Typically body 30 is a single crystal silicon wafer having an N-type conductivity of substantially uniform concentration therethrough preferably of between $2 \times 10^{15}$ and $5 \times 10^{16}$ per $cm^3$.

First impurity regions 32 and 33 are formed in body 30 adjoining surface 31. Regions 32 and 33 form first PN junctions 34 and 35 with the residual impurity concentration, respectively, of body 30 having shallow impurity concentration gradients less than $1 \times 10^{22}$ per $cm^4$. Typically, first impurity regions 32 and 33 are simultaneously formed using standard oxidizing, photoresist, etching and diffusion techniques. That is, body 30 is heated in an atmosphere of oxygen gas or steam to a temperature preferably between 1,000° and 1,200°C. to form an oxide layer 50 over surface 31 typically of about 10,000 A in thickness; windows (not shown) are opened in the oxide layer by photomasking and subsequently etching the portions of the oxide layer; and a P-type impurity such as boron is diffused into exposed portions of surface 31 through the windows in the oxide layer to a depth typically between 10 and 50 microns, by heating body 30 typically in open-tube apparatus to about 1,000°C. in an atmosphere containing diborane ($B_2H_6$) gas as a constant diffusion source. Regions 32 and 33 preferably have surface impurity concentrations between $1 \times 10^{16}$ and $1 \times 10^{18}$ per $cm^3$.

Second impurity regions 38 and 39 are formed in body 30 adjoining surface 31 and contained in first impurity regions 32 and 33, respectively. Regions 38 and 39 form PN junctions 40 and 41 with regions 32 and 33, respectively. Preferably second impurity regions 38 and 39 are simultaneously formed using the same oxidizing, photoresist, etching and diffusion techniques used to form first impurity regions 32 and 33. Typically second impurity regions 38 and 39 have surface impurity concentrations between $1 \times 10^{19}$ and $1 \times 10^{21}$ per $cm^3$ and have depths between 5 and 15 microns. Preferably second impurity regions 38 and 39 are formed of phosphorus using the same oxidizing, photoresist, etching and diffusion techniques used to form first impurity regions 32 and 33. Preferably, the oxide layer 50 is extended to close the windows used to diffuse regions 32 and 33 during the diffusion of regions 32 and 33 so that the next sequential steps are opening of new, smaller, concentric windows 51 and diffusing in regions 38 and 39 typically to a depth of between 5 and 15 microns.

Third impurity regions 42 and 43 are formed in body 30 adjoining major surface 31 spaced away peripherally of P-impurity regions 32 and 33 and forming PN junctions 44 and 45 with the impurity concentration of body 30. Fourth impurity regions 36 and 37 are also formed between first and third impurity regions 32 and 33 and 42 and 43, respectively. The third impurity regions are stopped short of full circumscription by gaps 46 and 47, respectively, to permit convenient interconnection of the thyristors by planar contacts. P-impurity regions 42 and 43 are preferably simultaneously formed of boron using the same oxidizing, photoresist, etching and diffusion techniques used to form P-impurity regions 32 and 33 by opening annular windows 52 in oxide layer 50 and shielding or temporarily closing windows 51. Regions 42 and 43 are preferred to have surface concentrations of between $1 \times 10^{16}$ and $1 \times 10^{18}$ per $cm^3$ and depths between 10 and 25 microns.

The light activated ac switch thus formed is finished by providing metal contacts 48 and 49 at surface 31 through windows 51 and 52. Contact 48 makes ohmic contact with impurity regions 32 and 43, which are thus interconnected through gap 46 in impurity region 42 and overlaying oxide layer 50. Metal contact 49 is connected to impurity regions 33 and 42, which are thus interconnected through gap 47 in impurity region 43 and overlaying oxide layer 50. Preferably the metal contacts are formed by evaporating or RF sputtering of aluminum, gold or some other suitable metal to close windows 51 and 52 and form a metal layer over oxide layer 50. A negative photoresist and suitable etchant is then used to remove the metal layer from portions of the oxide layer to leave contacts 48 and 49 in and adjacent to windows 51 and 52. The metal contacts are then alloyed with the silicon body by heating the body to form low-resistant ohmic contacts.

Figure 10:
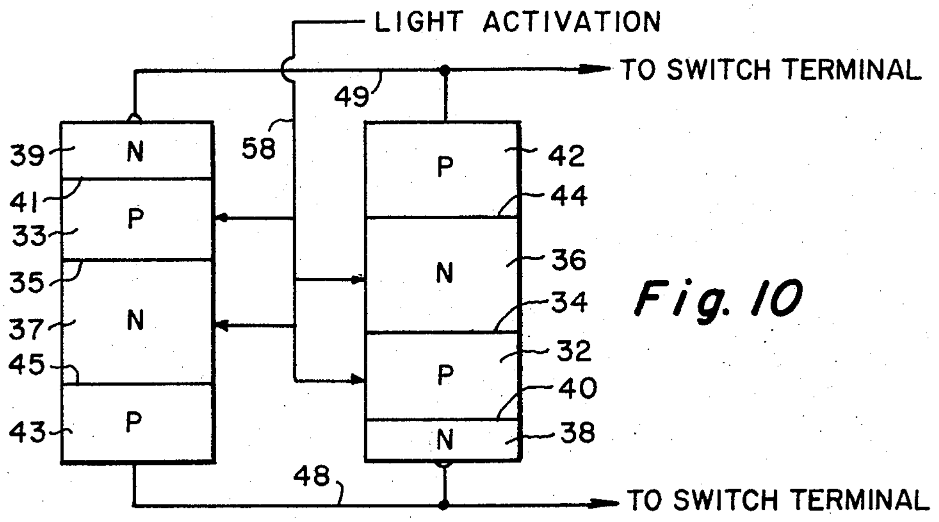
FIG. 10 is the equivalent circuit of the light-activated ac switch shown in FIGS. 8 and 9.

The light activated ac switch thus formed has cathode-emitters corresponding to second impurity regions 38 and 39, cathode-bases corresponding to first impurity regions 32 and 33, anode-bases corresponding to fourth impurity regions 36 and 37, and anode-emitters corresponding to third impurity regions 42 and 43. Metal contacts 38 and 49 connect the thyristors so that the resulting device is bidirectional on light activation. This is best seen by reference to FIG. 10 where the equivalent circuit of the ac switch is shown.

The light activated switching circuit is completed by applying an ac potential from an ac load 53 through load 54 to contact 48 and from contact 49 through lead 55 to output 56. The switching circuit is provided by a light radiation source 57 which illuminates major surface 31 at first and fourth impurity regions 32, 33, 36 and 37 with light radiation 58 to gate the thyristors.

A light gated ac switch with light sensitivity far greater than other light activated ac switch is thus provided. The light activated ac switch described is also capable of considerably higher frequency operation than electrode gated and other light gated ac switches. The reason for this is that, even though the activating light may be driving both thyristors simultaneously, there are no impurity regions which are conductivity modulated by emitter injection which are common to both thyristors. Consequently, recovery to the blocking mode is faster in the present invention when the gating light radiation is removed.

While the presently preferred embodiments of the invention have been specifically described, it is distinctly understood that the invention may be otherwise variously embodied and used within the scope of the following claims.

What is claimed is:

1. A light activated lateral thyristor circuit comprising:

a. a lateral thyristor formed in a semiconductor body of given impurity concentration having a major surface, said thyristor having a first impurity region of conductivity type opposite the given impurity concentration adjoining the major surface and forming a first PN junction with a shallow impurity concentration gradient less than about $1 \times 10^{22}$ per $cm^4$ with the given impurity concentration of the body, a second impurity region of conductivity type opposite the first impurity region adjoining the major surface, contained within the first impurity region and forming a second PN junction with the first impurity region, and a third impurity region of conductivity type opposite the given concentration adjoining the major surface, spaced from the first impurity region and forming a third PN junction with the given impurity concentration of the body and a fourth residual impurity region adjoining the major surface between the first and third impurity region;

b. a power source capable of applying a voltage potential ohmically between the second and third impurity regions; and c. a light radiation source capable of illuminating said major surface at at least portions of the first and fourth impurity regions to gate the thyristor as the voltage potential of the power source is applied.

2. A light activated thyristor circuit as set forth in claim 1 wherein:

the first and fourth impurity regions of the lateral thyristor have surface impurity concentrations between about $2 \times 10^{15}$ and $1 \times 10^{18}$ per $cm^3$.

3. A light activated thyristor circuit as set forth in claim 1 wherein:

the first and fourth impurity regions of the lateral thyristor have surface widths substantially equalizing grounded base current gains of the equivalent transistors of the thyristor.

4. A light activated lateral thyristor circuit as set forth in claim 1 wherein:

the impurity concentration gradient of the first PN junction of the thyristor is less than $1 \times 10^{20}$ per $cm^4$.

5. A light activated ac switch circuit comprising:

a. two lateral thyristors formed in a semi-conductor body of a given impurity concentration having a major surface, each said thyristor having a first impurity region of conductivity type opposite the given impurity concentration adjoining the major surface and forming a first PN junction with a shallow impurity concentration gradient less than about $1 \times 10^{22}$ per $cm^4$ with the given impurity concentration of the body, a second impurity region of conductivity type opposite the first impurity region adjoining the major surface, contained within the first impurity region and forming a second PN junction with the first impurity region, and a third impurity region of conductivity type opposite the given concentration adjoining the major surface, spaced from the first impurity region and forming a third PN junction with the given impurity concentration of the body and a fourth residual impurity region adjoining the major surface between the first and third impurity region;

b. interconnecting contacts ohmically connecting the second impurity region of each thyristor with the third impurity region of the other thyristor;

c. a power source capable of applying a voltage potential ohmically between the second and third impurity regions; and d. a light radiation source capable of illuminating said major surface at at least portions of the first and fourth impurity regions to gate the thyristor as the voltage potential of the power source is applied.

6. A light activated ac switch circuit as set forth in claim 5 wherein:

the first and fourth impurity regions of each lateral thyristor have surface impurity concentrations between about $2 \times 10^{15}$ and $1 \times 10^{18}$ per $cm^3$.

7. A light activated ac switch circuit as set forth in claim 5 wherein:

the first and fourth impurity regions of each lateral thyristor have surface widths substantially equalizing grounded base current gains of the equivalent transistors of the thyristor.

8. A light activated ac switch circuit as set forth in claim 5 wherein:

the impurity concentration gradient of the first PN junction of each thyristor is less than $1 \times 10^{20}$ per $cm^4$.

9. A light activated ac switch circuit as set forth in claim 5 wherein:

the interconnecting contacts are planar and partially overlay a dielectric layer adjoining the major surface of the semiconductor body.

* * * * *